United States Patent [19]

Smolanoff et al.

[11] Patent Number: 6,156,164
[45] Date of Patent: Dec. 5, 2000

[54] VIRTUAL SHUTTER METHOD AND APPARATUS FOR PREVENTING DAMAGE TO GALLIUM ARSENIDE SUBSTRATES DURING PROCESSING

[75] Inventors: Jason Smolanoff, Jefferson Valley, N.Y.; Doug Caldwell, McKinney, Tex.; Glyn Reynolds, Gilbert, Ariz.

[73] Assignee: Tokyo Electron Limited, Tokyo, Japan

[21] Appl. No.: 09/337,574

[22] Filed: Jun. 22, 1999

[51] Int. Cl.[7] ............................ C23C 14/35; C23C 14/54
[52] U.S. Cl. ................ 204/192.12; 204/192.13; 204/192.15; 204/192.16; 204/192.17; 204/192.22; 204/192.32; 204/192.33; 204/298.02; 204/298.03; 204/298.06; 204/298.07; 204/298.11; 204/298.12; 204/298.15; 204/298.19; 204/298.23; 204/298.31; 204/298.32
[58] Field of Search ................ 204/192.12, 192.13, 204/192.15, 192.16, 192.17, 192.22, 192.32, 192.33, 298.02, 298.03, 298.06, 298.07, 298.11, 298.12, 298.15, 298.19, 298.31, 298.32, 298.23

[56] References Cited

U.S. PATENT DOCUMENTS

| | | |
|---|---|---|
| 4,915,564 | 4/1990 | Eror et al. .......................... 414/217 |
| 5,593,551 | 1/1997 | Lai ................................. 204/192.12 |
| 5,632,869 | 5/1997 | Hurwitt et al. .................. 204/192.12 |
| 5,685,941 | 11/1997 | Forster et al. ....................... 156/345 |
| 5,830,330 | 11/1998 | Lantsman ........................ 204/192.12 |
| 5,976,334 | 11/1999 | Fu et al. ........................... 204/298.19 |

*Primary Examiner*—Alan Diamond
*Attorney, Agent, or Firm*—Wood, Herron & Evans, L.L.P.

[57] ABSTRACT

Damage to a gallium arsenide substrate during plasma ignition for PVD processing is avoided by a virtual shutter, which provides the functions without the disadvantages of a mechanical shutter to minimize the density of high energy particles created during plasma ignition from reaching the GaAs substrate. A plasma ignition process sequence uses a high pressure gas ignition gas burst in combination with the control of other parameters, such as (a) varying the plasma ignition gas composition to include xenon, krypton or fluorinated molecular gases, (b) varying target-to-substrate distance to at least double the distance during plasma ignition, (c) increasing the magnetron magnetic field strength either permanently or during plasma ignition to about 400 Gauss, (d) preconditioning the target by sputtering whenever the system has been idle for several minutes, (e) adjusting the power supply power ramping to the target over 5–6 seconds or more, and/or (f) using a simple electric circuit to drain charge build up on the GaAs substrate.

36 Claims, 7 Drawing Sheets

VIRTUAL SHUTTER METHOD AND APPARATUS FOR PREVENTING DAMAGE TO GALLIUM ARSENIDE SUBSTRATES DURING PROCESSING

This invention relates to the physical vapor deposition and, more particularly, to a method and apparatus for depositing onto substrates, particularly substrates formed of gallium arsenide, coatings, particularly refractory metal coatings, by physical vapor deposition.

BACKGROUND OR THE INVENTION

In the manufacture of semiconductors that are formed using gallium arsenide (GaAs) wafers, device feature dimensions such as integrated circuit implant depth and gate width continue to decrease. To form such features, deposition of refractory metals is typically employed. Conventional processes for depositing refractory metals have the potential of causing damage to GaAs substrates that adversely affects devices being formed thereon that have features having such decreased dimensions. Physical vapor deposition (PVD) has become recognized as a process useful to deposit refractory metals to form sub-micron sized features such as, for example, ohmic and Shottky contacts, on GaAs wafers.

Certain stages of a PVD process, such as the plasma ignition stage, can subject the surface of a GaAs substrate to damage. For example, implanted n-type GaAs surfaces that are exposed directly to the plasma ignition stage in a DC magnetron PVD system can incur damage from impinging secondary electrons, from ions, and from reflected fast neutral atoms that are produced during plasma ignition. The damage caused by a DC magnetron sputter coating PVD process is approximately $10^{-3}$ times that of typical plasma processing techniques such as reactive ion etching (RIE) and electron cyclotron resonance (ECR) etching. Although DC magnetron sputtering produces relatively low damage to GaAs substrates, the performance of some devices such as field effect transistors (FETs) can be affected by damage resulting from DC magnetron PVD. Device parameters affected by the damage are FET gain, breakdown voltage, and transconductance. Typical of such damage is the implantation of ions and neutral atoms, the production of broken bonds or the formation of dangling bonds in the surface microstructure, and the changing of the density and type of surface states.

Unlike RIE and ECR, the damage induced by DC magnetron PVD sputtering is self-limiting. For example, regardless of process time, within the first second of the process 75% of the total damage is completed and after two seconds, 100% of the damage has taken place. Due to the physics of DC magnetron PVD processing, the damage that it produces on GaAs substrates is believed to be localized to a region adjacent the surface (30 Å to 60 Å deep) of the GaAs implanted region. Nonetheless, the damage produced during plasma ignition is sufficient to materially reduce the quality and quantity of devices produced by PVD.

To date, when sputtering refractory ohmic or gate metal using a PVD sputter apparatus, such as a batch processor or a cluster style tool, the placement of a physical shutter in front of the substrate has been needed to protect the substrate such as a GaAs substrate from damaging particles created during plasma ignition. Although a physical shutter is effective to reduce damage during plasma ignition, there are several disadvantages to using a physical or mechanical shutter in a manufacturing environment. For example, since a physical shutter is typically situated above the wafer, it receives a large amount of metal deposit. As it moves in a vacuum, it generates a significant number of particles, typically adding more than 500 particles of 0.5 microns or larger. As gate sizes decrease, high particle density increases the number of defective devices produced and thereby reduces device yield. Further, a physical shutter is prone to mechanical failures and requires preventive maintenance, both of which add to system downtime.

Accordingly, there remains a need to eliminate the requirement for a physical shutter in the PVD of refractory metals onto GaAs substrates while providing damage free deposition.

SUMMARY OF THE INVENTION

A primary objective of the present invention is to provide a method and an apparatus by which substrates that are prone to damage during plasma ignition are protected from such damage without the need to shield such substrates with a physical shutter. A particular objective of the invention is to provide a method and apparatus for depositing refractory metals onto damage prone substrates, especially gallium arsenide substrates, by physical vapor deposition processes while minimizing the damage caused to the substrate surface. A further particular objective of the present invention is to generally eliminate the need for a physical shutter in PVD, especially in PVD of refractory metals onto GaAs substrates.

The present invention achieves its objectives in part by controlling the parameters of a PVD system in such a way as to minimize the density of high energy particles created during plasma ignition from reaching the substrate. Such high energy particles are those particles having sufficient energy to damage a substrate such as GaAs wafer. The invention does so without the use of a mechanical or physical shutter. The invention incorporates a plasma ignition process sequence using a relatively high pressure gas burst in combination with the control of one or more other parameters of the system. The control of other parameters includes: (a) varying the plasma ignition gas composition, and (b) varying target-to-substrate distance, each to maximize the effectiveness and number of gas phase scattering events. The control of other parameters further includes: (c) increasing the magnetron magnetic field strength so as to capture a higher number of secondary electrons emitted from the sputter target, and (d) the use of a sputter target cleaning procedure to reduce the density of secondary electron emission. Additionally, the control of other parameters includes: (e) adjusting the power supply power ramping-up time to the target, and (f) the use of a circuit to drain charge build up on the floating GaAs substrate.

In the preferred embodiment of the invention, a plurality, or more preferably a majority, of the steps of controlling other parameters is employed with the high pressure gas burst in the plasma ignition sequence. All of the other parameter controls may be used and optimized in order to minimize, without the use of a mechanical shutter, the density of particles reaching the GaAs substrate that are created during plasma ignition and that have sufficient energy to damage the GaAs wafer.

The plasma ignition process sequence of the present invention as set forth herein is referred to as a "virtual shutter" and produces the desired function, traditionally achieved only by the use of a mechanical shutter, of prohibiting damage induced during the plasma ignition step of a DC magnetron PVD sputtering process on GaAs surfaces.

The invention, however, does so without the use of a physical or mechanical shutter and hence without the disadvantages of a physical shutter. Damage that would cause surface state changes due to secondary electron impingement is particularly avoided using the virtual shutter of the present invention.

These and other objectives and embodiments of the invention are set forth in the following detailed description of the drawings, in which:

DETAILED DESCRIPTION OF THE PREFERRED EMBODIMENTS

The preferred embodiment of the present invention provides a virtual shutter for a physical vapor deposition (PVD) apparatus such as a sputter coating apparatus. One such apparatus is described, for example in commonly assigned U.S. Pat. No. 4,915,564, hereby expressly incorporated by reference herein. By "virtual shutter" is meant a feature or combination of features that serve the purposes of a physical or mechanical shutter of a type commonly used in sputter coating or other PVD equipment to shield a substrate or other article from coating material deposition or bombardment by energy or particles during some phase of the operation of the apparatus, but which does so without the actual use of a physical or mechanical shutter.

The virtual shutter of the present invention provides, in its preferred embodiment, a combination of hardware and process configurations having several components, including: (1) a plasma ignition gas burst sequence, and (2) parameter controls from among the following: (a) plasma ignition gas species selection, (b) DC magnetron magnet field strength variation, (c) target to substrate distance variation, (d) a sputter target conditioning procedure, (e) cathode power ramp control, and (f) control of substrate floating potential.

Each component of the combination makes a contribution to the virtual shutter's function of prohibiting secondary electrons, reflected neutral atoms, and ions from striking the GaAs surface. Since secondary electron emission is dependent upon the sputter material, the optimum configuration of the virtual shutter depends on the sputter material being used and, accordingly, the configuration differs from sputter material to sputter material to maximize effectiveness of the virtual shutter.

Plasma Ignition Gas Burst Sequence

Use of a plasma ignition gas burst sequence is essential to the virtual shutter of the preferred embodiment of the invention. The reliability and effectiveness of the plasma ignition gas burst sequence is dependant upon the configurations of the other parameter controls discussed below. The plasma ignition gas burst sequence is a pre-deposition process designed to ignite a low damage plasma, comparable to a plasma ignition sequence with a mechanical shutter closed, and to prepare the chamber conditions to deposit thin films during the portion of the process comparable to that performed with a mechanical shutter open. The plasma ignition gas burst sequence uses either argon (Ar), krypton (Kr), xenon (Xe), or mixtures of fluorinated molecular gases with Ar, Kr, or Xe burst gas.

In the first step of the plasma ignition gas burst sequence, a plasma ignition gas is released into the chamber to produce a relatively high pressure in the process chamber, for example, in the range of from 100 to 500 mTorr. The process time for this step is set to be sufficiently long enough to allow the gas to equilibrate or equalize throughout the chamber. In the second step of the plasma ignition gas burst sequence, plasma ignition takes place using low ignition power level of, for example, 50–200 Watts. These two steps are referred to herein as the virtual shutter closed portion of the processes.

Following plasma ignition, the gas burst is terminated, and the process progresses to that portion referred to herein as the virtual shutter open portion of the process, with argon (Ar) process gas being introduced into the chamber for sputtering. During this "opening" of the virtual shutter, the plasma remains at the low ignition power level for a time sufficient to allow cathode voltage to stabilize.

Then, thin film deposition begins with the DC magnetron power increasing to the process power set point. To achieve this, the apparatus power supply is programmed to reach the set point in six seconds.

Details of the use of increased pressure in plasma ignition followed by return to lower pressures for processing in PVD are disclosed in the commonly assigned U.S. Pat. No. 5,830,330 entitled Method and Apparatus for Low Pressure Sputtering, hereby expressly incorporated by reference herein.

Plasma Ignition Gas Species

The effect of the plasma ignition gas burst sequence is optimized by controlling other parameters such as the plasma ignition gas species used in the gas burst sequence. This may be varied depending upon the sputter material being deposited. For materials that were observed to cause higher levels of damage such as tungsten-titanium (WTi), xenon is preferred. Since the damage is much lower when sputtering titanium, argon is sufficient. For materials with high secondary electron emission coefficients, such as insulating materials or surfaces with a high carbon or oxygen content, mixtures of fluorinated molecules and noble gases are preferred.

DC magnetron magnet field strength

The effect of the plasma ignition gas burst sequence may be optimized by controlling other parameters such as DC magnetron magnet field strength where possible. Where alternative magnetron magnet assemblies are available, the one that produces a higher field strength reduces plasma ignition phase damage to the substrate to a greater degree than one producing a weaker magnetron field. For example, replacing a DC magnetron magnet pack producing a field strength of less than 300 Gauss with one producing a higher magnetic field strength of approximately 400 gauss, for example, optimizes the function of the virtual shutter in its closed condition, reducing substrate damage during plasma ignition. Where magnet field strength is electrically controllable, such as with magnetrons using electromagnets or in systems where field strength is adjustable by moving permanent magnets, increasing field strength during the virtual shutter closed condition reduces substrate damage during plasma ignition.

Target-to-Substrate Distance

The effect of the plasma ignition gas burst sequence is optimized by controlling other parameters such as by providing an increased target-to-substrate distance. The distance variation that is desired is dependent upon the sputter material. Providing a greater than conventional target-to-substrate distance during virtual sputter closed operation, that is, during the ignition gas burst sequence and plasma ignition, enhances the damage avoidance produced by other parameters. The target-to-substrate distance may be set to a distance that is greater than would otherwise be required during the deposition process. Preferably, the target to substrate distance is, during plasma ignition, more than twice the target-to-substrate distance during normal sputter deposition from the target onto the substrate. Preferably, the distance is increased for plasma ignition from that used during PVD processing, and preferably it is more than doubled during plasma ignition. For example, it is preferred to increase the target-to-substrate distance from approximately 2 inches during a deposition sequence to approximately 5 inches during a plasma ignition sequence, then returning it to approximately 2 inches for the next deposition sequence.

Sputter target conditioning sequence

The effect of the plasma ignition gas burst sequence is optimized by controlling other parameters such as target precondition. A conditioning sequence may be performed prior to plasma ignition and deposition, and is preferred whenever the system has been idle for any significant period of time, such as, for example, for more than 20 minutes where materials such as titanium or titanium-tungsten are being sputtered. A specific target conditioning example is described in the example below. It preferably includes using process wafers and sputtering parameters that mimic the deposition process. The DC magnetron cathode power used for this step is preferably the same as that used for the deposition test. During each process run, the cathode voltage is monitored, and the conditioning step is regarded as completed when the cathode target voltage is stabilized. For most materials, three to ten process steps stabilize the cathode voltage.

Power Supply Ramp Time

The effect of the plasma ignition gas burst sequence is optimized by controlling other parameters such as by controlling the ramp time of the target power supply over several seconds. A ramp time of at least about three seconds is preferable. Setting the power ramp time closer to at least about six seconds is, however, more desirable.

Control of the Substrate Floating Potential

The substrate floating potential is preferably controlled so as to be fixed. For example, fixing the substrate potential at approximately −12 volts is preferable. This can be accomplished by using a 12 volt zener diode, with the cathode side of the diode connected to the system ground and the anode side of the diode attached to the substrate.

EXAMPLES

Each component of the virtual shutter concept evaluated for damage reduction has been evaluated in experiments by monitoring changes in sheet resistance ($R_S$) on n-type GaAs substrates. In such experiments, GaAs substrates were prepared by implanting new GaAs wafers with silicon (Si), encapsulated with silicon nitride ($Si_3N_4$), and the implant was activated using a rapid thermal anneal. After removing the $Si_3N_4$, the pre-deposition $R_S$ of the n-GaAs wafers was measured using a non-contact resistivity measurement system. The n-GaAs wafer was then used to test various plasma ignition and deposition sequences. After PVD processing, the deposited metal was chemically etched and the post-deposition $R_S$ was measured. The change in $R_S$ was calculated by using the difference of the average post and pre-deposition values. The average value comprised fifty-four measurement points per wafer.

The magnitude of the $R_S$ change is a strong indicator of FET device performance. Increasing changes in $R_S$ values correspond to higher levels of damage. The experimental procedure had about a 10 ohms per square error. The correlation between $R_S$ change and FET device performance has been verified with electrical data. Measured $R_S$ changes below 20 ohms per square (ohms/sq) are associated with electrically undetectable damage on the n-GaAs surface, for GaAs implanted regions 800 Å and deeper.

The contribution of each component of the virtual shutter lowers the $R_S$ change and therefore, lowers the damage to the surface. The virtual shutter was demonstrated using titanium (Ti) and tungsten-(10%)titanium (WTi) as sputtering target material. As stated previously, the virtual shutter was configured differently for the different sputter material types. In the tables below, the standard refers to the damage contribution from a PVD system without the present invention. Sample virtual shutter configurations for Ti sputter deposition and WTi sputter deposition are set forth in Table 1.

TABLE 1

Virtual Shutter Configurations

| | Titanium | Tungsten(10%)Titanium |
|---|---|---|
| Plasma Ignition Species | Argon | Xenon |
| Sputter Gas Species | Argon | Argon |
| Target-to-Substrate Distance | 2.5 inches | 5.0 inches |
| DC Magnet Type | 400 Gauss | 400 Gauss |
| DC Power Ramp Time | 6 seconds | 6 seconds |
| Conditioning, No. of Wafers | 3 | 10 |
| Substrate Voltage | 12 Volts | 12 Volts |

The plasma ignition gas burst sequence is configured to mimic the functionality of a physical shutter. Although the components change to accommodate different sputter materials, the sequence remains substantially the same from sputter material to sputter material. The pre-plasma ignition high pressure step referred to is with the shutter when in the closed position. The shutter effectiveness is directly related to the scattering cross section, mean free path, and collision frequency of secondary electrons, atoms, and ions with the plasma ignition gas. Typical chamber pressures during the gas burst are between 160 and 250 mTorr. At these pressures, the mean free paths for atoms and ions are on the order of 1 04 meters. At target-to-substrate distances of 2 to 5 inches, these particles experience hundreds of collisions and become thermalized before reaching the substrate, making their contribution to damage of the substrate negligible. The mean free path for primary electrons is considerably longer, on the order of $10^{-2}$ to $10^{-3}$ meters.

Figure 1:
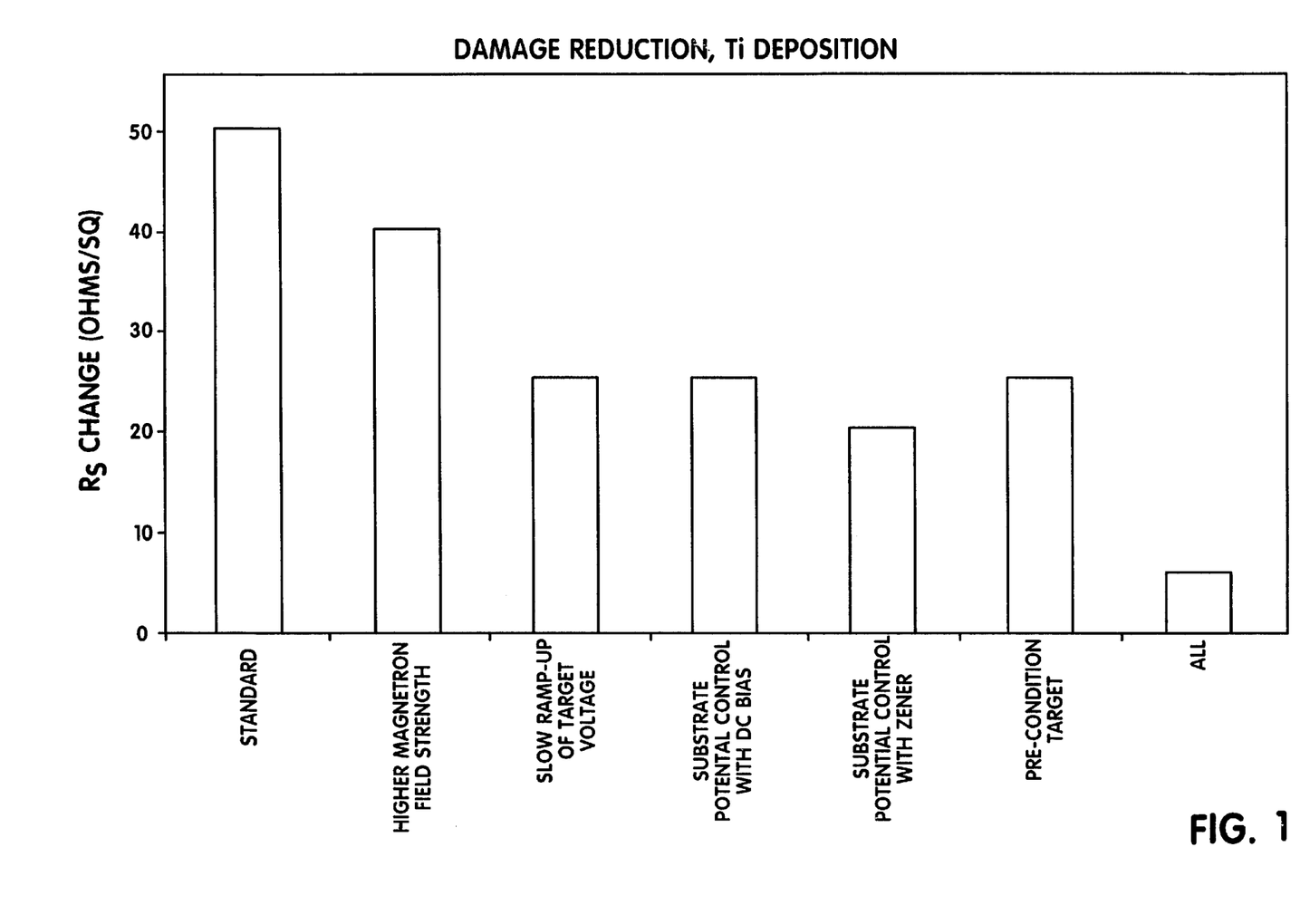
FIG. 1 is a graph comparing the effects of the various controlled parameters in the present invention.

For a titanium deposition (Ti) case shown in FIG. 1, the damage becomes negligible once the high pressure burst is combined with the other controlled parameters. For example, each of the controlled parameters, except for the higher magnetron field strength, either alone or combined with others, lower the $R_S$ change into the 25 ohm/sq range. Implementing the gas burst with the modifications, decreased the $R_S$ change by a factor of 2.5 for Ti using Ar for the sputter gas.

Figure 2:
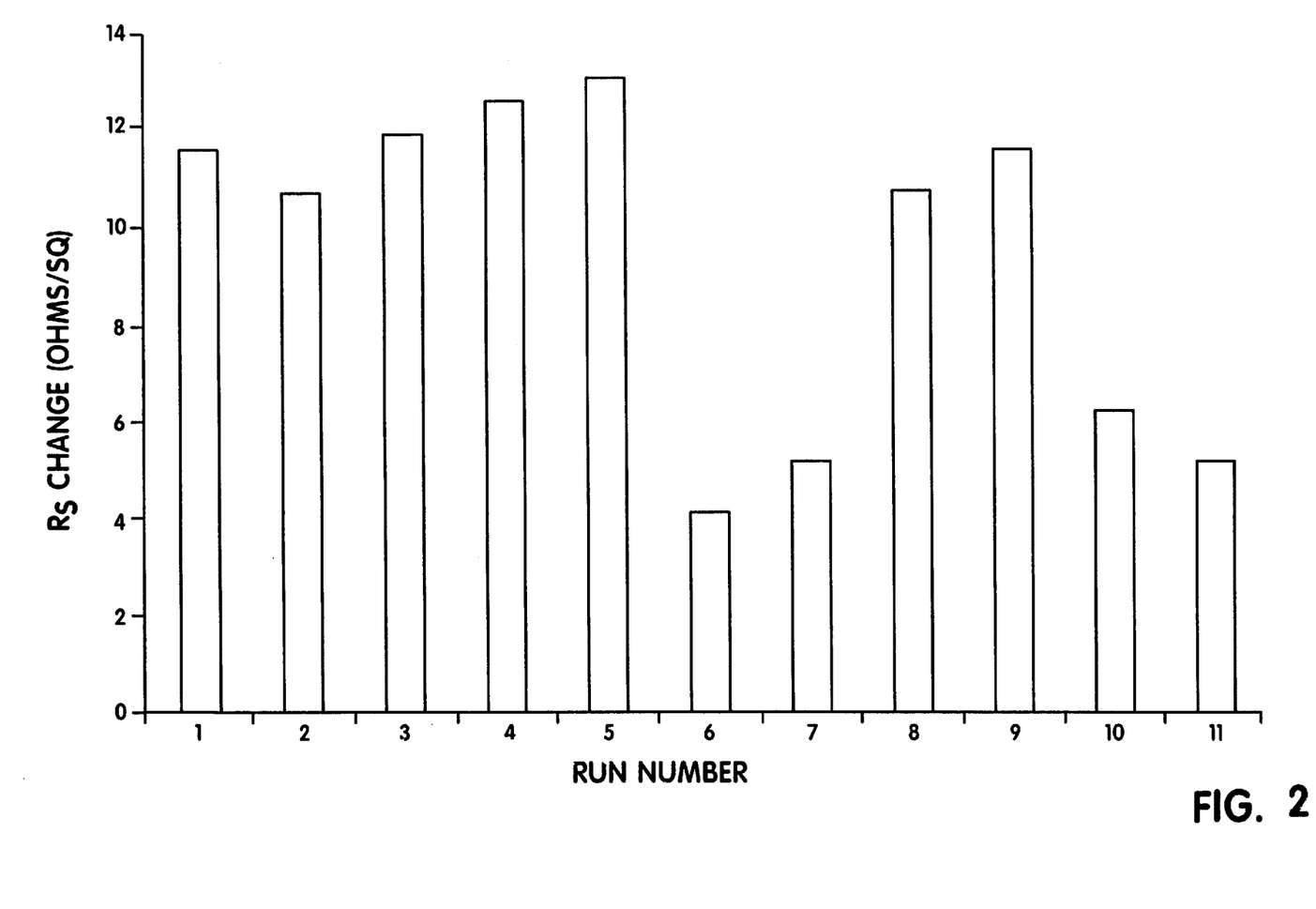
FIG. 2 is a graph illustrating the repeatability of data illustrated in FIG. 1.

The repeatability of the performance of the virtual shutter technique for depositing Ti using Ar as the process gas was tested by repeating the identical process over a one month period. During this time, the system underwent the normal preventive maintenance schedule, and several kilowatt hours of material were removed from the sputter target. This data was validated using electrical data from active devices. The results from the virtual shutter are very reproducible, as illustrated in FIG. 2. The variations at run numbers 6,7, 10, and 11 are due to variations in the chemical etch used for preparing the samples.

Figure 3:
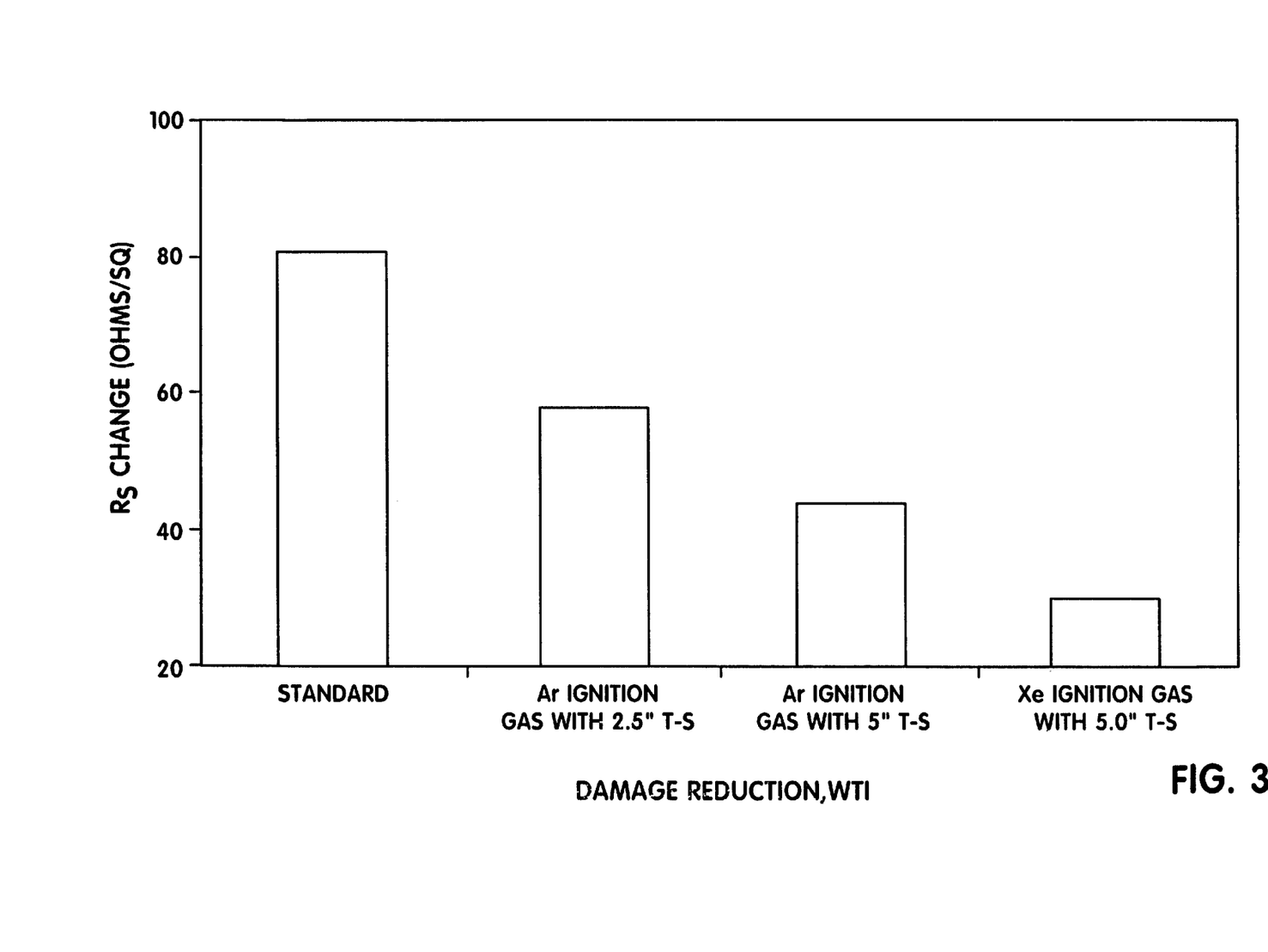
FIG. 3 is a graph similar to FIG. 1 comparing the effects of different controlled parameters.

At typical sputtering pressures, the $R_S$ change for tungsten-titanium (WTi) deposition was found to be approximately 40% higher than for titanium (Ti) deposition when all of the parameter controls illustrated in FIG. 1 are used. Processing WTi using the virtual shutter with argon and a 2.5 inch target-to-substrate spacing (T-S) decreased the $R_S$ change by approximately 28%. Increasing the T-S to 5.0 inches with argon lowered the $R_S$ change by another 20%. This is illustrated in FIG. 3. As the T-S becomes larger, the mean number of collisions increases and the $R_S$ change decreases. Although the WTi damage is decreased by almost 50% from the standard process, a considerable amount of damage still occurs.

The virtual shutter pressure and target-to-substrate spacing increase is sufficient to effectively scatter atoms and ions and eliminated the damage contribution when sputtering Ti. Accordingly, a sputter material dependance is observed in the process. One difference between sputter material that is believed to affect the effectiveness of the virtual shutter is the secondary electron emission coefficient. Experimental and theoretical data for secondary electron emission coefficients for Ti and W are shown in Table 2.

TABLE 2

Experimental and Theoretical
Secondary Electron Emission Coefficients

|    | Ar (e-/per incident e-) | Ar (e-/per incident ion) | Kr (e-/per incident ion) | Xe (e-/per incident ion) |
|----|-------------------------|--------------------------|--------------------------|--------------------------|
| Ti | 0.9                     | 0.113                    | 0.0854                   | 0.0555                   |
| W  | 1.4                     | 0.107                    | 0.0784                   | 0.0485                   |

The coefficient for W is 50% higher than that for Ti (emission per incident primary electron), while the theoretical coefficient for W is slightly lower than that for Ti (emission per incident ion). The theoretical values in Table 2 are rough estimates of the coefficient. The actual secondary emission coefficients are dependent upon surface conditions, alloy composition, contamination and morphology. The $R_S$ change and electrical data from n-GaAs substrates suggest that the WTi alloy has a higher secondary emission coefficient than Ti.

Therefore, plasma ignition conditions that generate fewer secondary electrons are preferred. The effectiveness of the virtual shutter is at least in part based upon collisional events during plasma ignition. Physical properties of the elements involved are set forth in Table 3.

TABLE 3

Physical Properties

| Species | Ionization Potential (eV) | Work Function (eV) | Polarizability (10–24 cm3) |
|---------|---------------------------|--------------------|----------------------------|
| Ti      | 6.82                      | 4.33               | 14.6                       |
| W       | 7.98                      | 4.55               | 11.1                       |
| Ar      | 15.759                    | —                  | 1.64                       |
| Kr      | 13.999                    | —                  | 2.48                       |
| Xe      | 12.130                    | —                  | 4.044                      |

Therefore, using the physical properties in Table 3 and the trends found in Table 2, with WTi, a plasma ignition gas species of Xe is preferred. Xe facilitates plasma ignition due to its high polarizability and the low ionization potential when compared to other noble gases. The polarizability of Xe gas is 2.5 times the value for Ar gas, and the ionization potential is 3.629 eV lower than for Ar. Further, the electron collision probability, which is defined as the average number of collisions in a 1 cm path of gas at 1 Torr, for Xe is 3.3 times higher for Ar. In addition, Xe lowers the kinetic energy of the secondary electrons. The kinetic energy (KE) of a secondary electron (se) is dependent upon the ionization potential (IP) of the process gas.

$KE(se)=IP(\text{process gas})-(2\times\text{Work Function (sputter material)})$ By lowering the IP of the process gas during ignition, the energy of the secondary electrons decreases. Also as illustrated in Table 2, by increasing the mass of the process gas, the secondary emission coefficients decrease for a given energy. Using Xe as the process ignition gas, the damage was lowered another 35% from the virtual shutter configuration using Ar and a T-S of 5.0". Overall, the virtual shutter reduced WTi damage from an $R_S$ change of more than 75 ohms per square to 28 ohms per square. This configuration can be further optimized to reduce the $R_S$ change to below 20 for WTi.

Improvements of the plasma ignition gas burst can be made by incorporating small amounts of fluorinated gas molecules with the noble gases used for plasma ignition. This will increase the contribution of electron polarization scattering, elastic and inelastic collisions, and promote electron-ion recombination. This is particularly useful for sputtering insulating material which typically has high secondary electron emission coefficients.

In addition to using various gas burst species and T-S values, the DC magnetron magnetic field is preferably increased. The magnetic field used in a magnetron application is often designed to confine and accelerate secondary electrons back into the plasma to maintain the discharge. A standard magnet pack configuration may have a field strength less than 300 Gauss. By increasing the magnetic field strength to approximately 400 gauss to capture more secondary electrons, the $R_S$ change has been lowered, for example, from 52 to 40 ohms/sq, a 23% decrease, as illustrated in FIG. 1.

Figure 4:
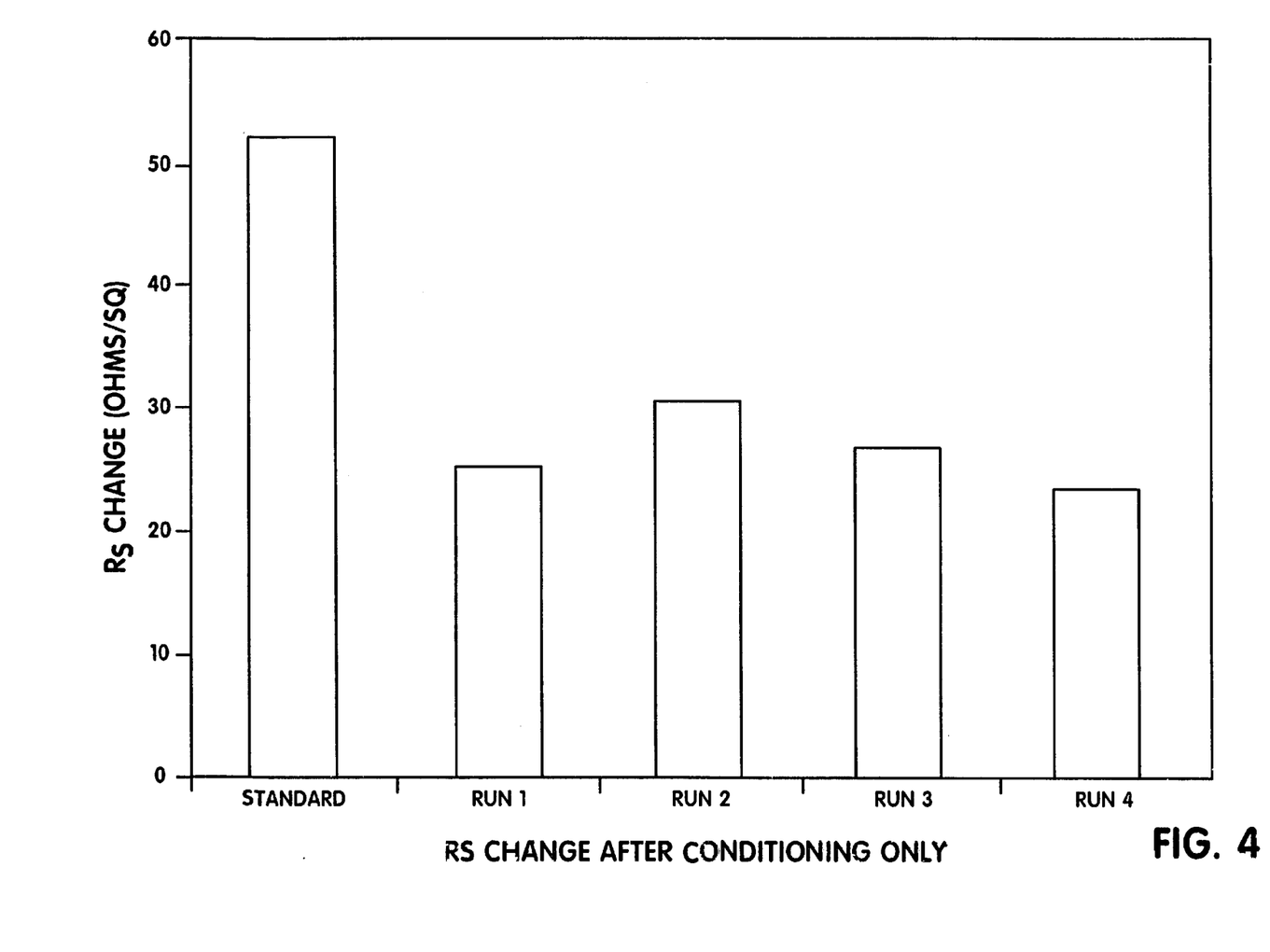
FIG. 4 is a graph similar to FIG. 3 illustrating the effects of the controlled parameter of target condition.
Figure 5:
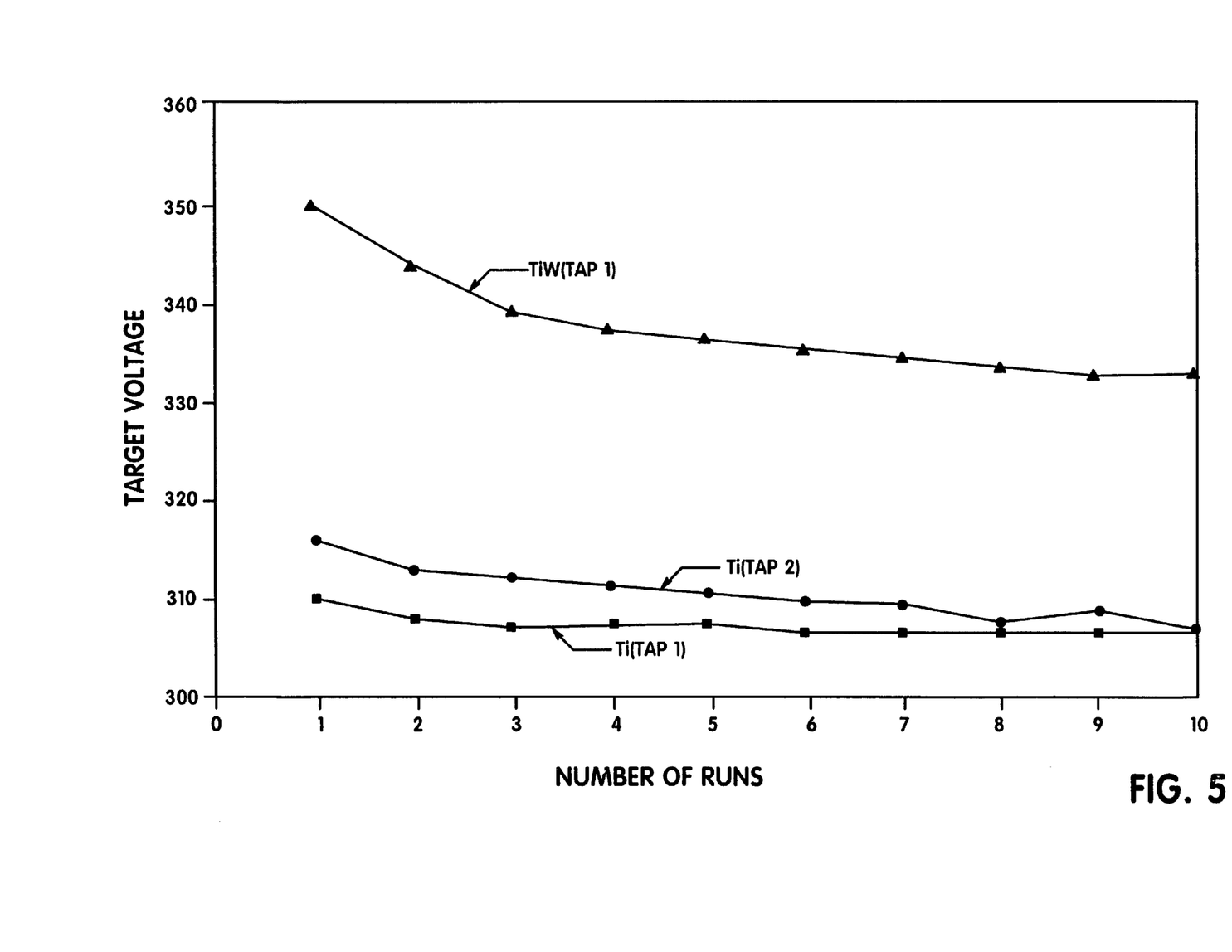
FIG. 5 is a graph illustrating the relationship between target voltage and the number of conditioning runs.

The $R_S$ change is a strong function of sputter surface conditioning. In FIG. 4, the sputter target conditioning sequence reduces the $R_S$ change from 52 to an average of 25 ohms/sq. Secondary electron yield is sensitive to the sputter surface conditions. For example, contamination of the sputter surface with organic or oxide materials can increase the secondary electron emission coefficient by a factor of two to three. The conditioning sequence used is equivalent to the performance of a PVD sputtering process on several wafers prior to performing the actual coating of the GaAs substrates. The sputtering process cleans off contamination and oxides from the sputter material surface. Cathode voltage can be monitored to determine the cleanliness of the sputter material, as illustrated in FIG. 5. As the sputter material surface is cleaned, the cathode voltage decreases. For Ti, this procedure is complete after the equivalent of three wafer processing cycles worth of material is sputtered from the target, while for WTi sputtering of up to ten wafer processing cycles has been found to be preferred. In addition to reducing secondary electron yield, the conditioning sputter sequence characterizes the impedance of the process chamber and provides a chamber quality baseline for future testing and processing.

The substrate is frequently electrically floating. During the plasma ignition, the substrate takes on a positive potential, and becomes slightly negative after the plasma stabilizes. To reduce the range of substrate potential while keeping the electrically floating characteristic, a 12 volt zener diode may be attached to the substrate, with the cathode side of the diode connected to system ground and with the anode side attached to the substrate. With the zener diode, the substrate is fixed at, for example, −12 volts during the plasma ignition and process. Any charge build up due to particle impingement passes to ground. The zener diode lowered the $R_S$ change (see FIG. 1) by approximately 30 ohms/sq from the standard.

Figure 6:
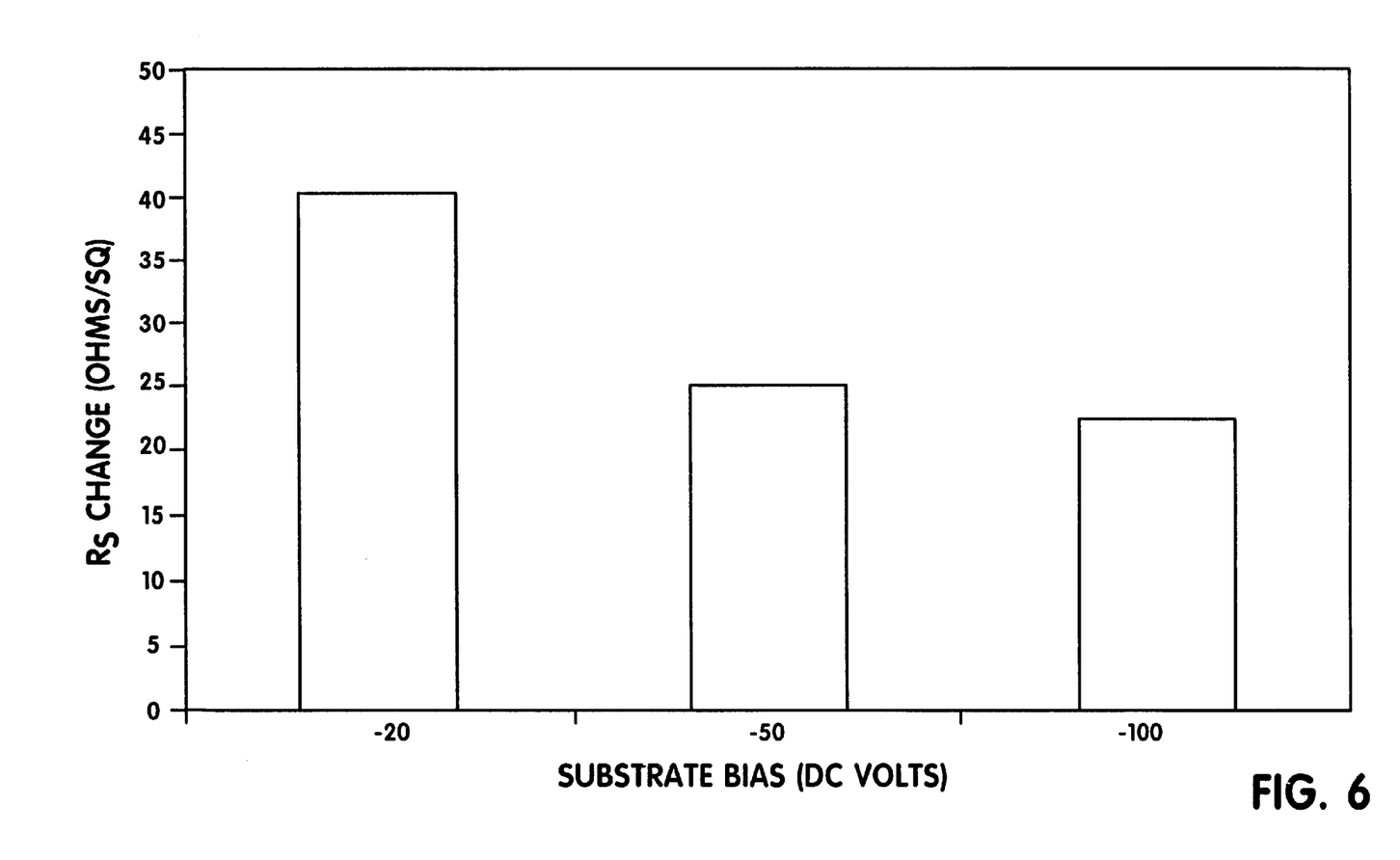
FIG. 6 is a graph similar to FIG. 4 illustrating the effects of a controlled parameter of substrate bias.

Damage to n-GaAs substrates is confirmed to result from electrons by applying a DC electric field to the substrate to repel electrons, producing the results illustrated in FIG. 6. A negative DC potential applied to the substrate repels at least low energy electrons. As the negative potential is decreased, the $R_S$ decreases by approximately 50% from the "standard", as the data in the figure illustrates.

The preferred embodiment of the invention is one where all of the components or other control parameters referred to above are employed to lower the damage to an electrically undetectable level on a n-GaAs surface. The mechanism for damage to a GaAs surface and degradation of FET device parameters is believed to be largely due to secondary electrons striking the n-GaAs surface and changing the density and type of surface states. For example, the n-GaAs surface might have a high number of donor states. It is believed that during the PVD process, the surface is bombarded with secondary electrons and these states become neutralized, thus lowering the FET performance. This is intended only to be a theoretical view of the mechanism, and the scope of the invention which is not intended to be limited by the theory involved.

Figure 7:
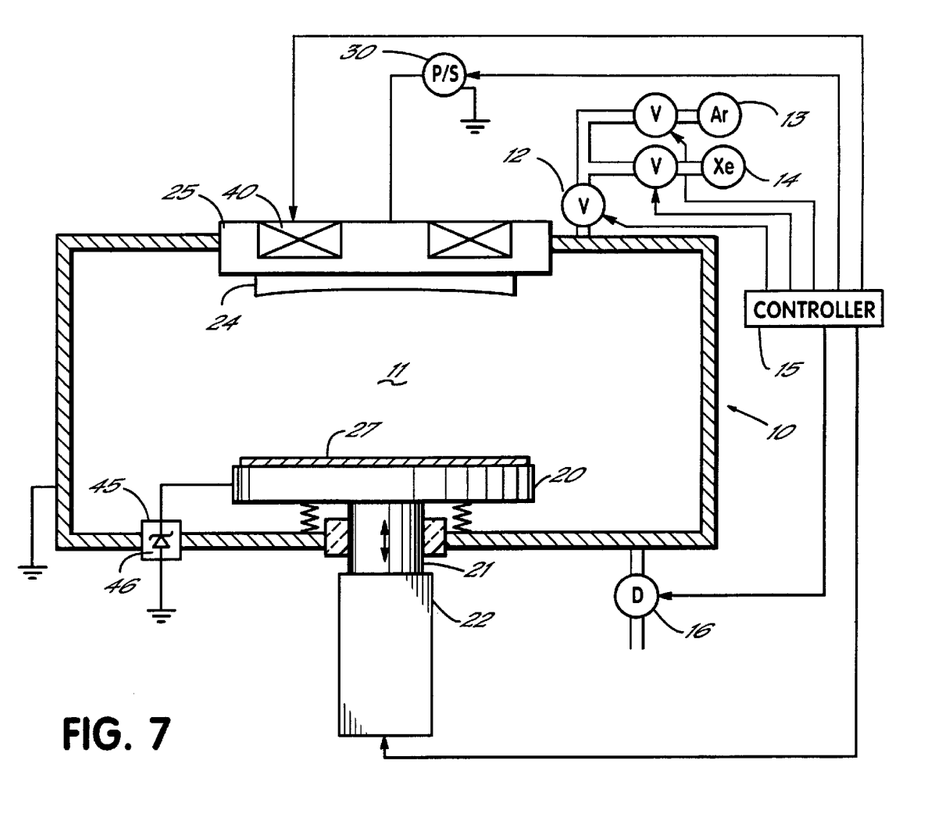
FIG. 7 is a diagrammatic illustration of a sputter coating chamber embodying principles of the present invention.

FIG. 7 illustrates a sputter coating apparatus 10 in which the method of the invention may be performed. It includes a vacuum processing chamber 11 having a gas inlet control 12 through which any one of a variety of gases may be introduced into the chamber 11. For example, the source 12 may include a source 13 of argon to be used for sputtering and a source 14 of xenon to be used for plasma ignition. A controller 15 is provided, which may be programmed to cause the filling of the chamber 11 with xenon from source 14 during plasma ignition and then to evacuate the xenon while pumping the chamber 11 to a lower pressure by a vacuum pump 16 and a filling of the chamber 11 at this lower pressure with argon from the source 13 during sputter coating.

The chamber 11 has a substrate support or holder 20 at one end thereof fixed to the top of a moveable mount 21 which can be raised and lowered by an elevator 22 under the control of the controller 15. At the other end of the chamber 11 opposite the support 20 is a sputtering cathode assembly 24 having a sputtering target 24 supported thereon which faces a substrate 27, of for example GaAs, on the support 20. The elevator 22 may be controlled by the controller 15 so that the mount 21 may be lowered during plasma ignition to increase its distance from the target 24 and raised to bring the substrate 27 closer to the target 24 during deposition.

A power supply 30 is connected to the cathode 25 to energize the target 24 for sputter processing of the substrate 27. The power supply 30 is preferably controlled by the controller 15 such that the power to the target is low during plasma ignition and is gradually increased over a period of about four to eight seconds to the power level used for sputtering. A magnetron magnet assembly 40 is included in the cathode assembly 25 which is configured to produce a relatively strong magnetic field in the chamber 11 during plasma ignition. This magnet may be of variable field strength, such as an electromagnet or moveable permanent magnet, that is controlled by the controller 15 in a way that increases field strength during plasma ignition. Alternatively, a separate magnet may be provided to increase field strength during plasma ignition. If variable magnets are not practical, the magnetron magnet should be selected which provides a stronger than average field.

A voltage limiting circuit 45 is also provided between the substrate support 20 and the chamber ground in order to limit the potential on the substrate 27 during plasma ignition. This circuit 45 may include a zener diode 46 or other components or controls to prevent high substrate potential from developing during plasma ignition.

The above embodiment is described in the context of protecting GaAs wafers from damage. Presently, the invention is most useful for protecting GaAs substrates from damage during plasma ignition. The invention, however, has utility with wafers of other types, for example, those having shallow junction devices thereon. Wafers that are prone to damage during plasma ignition, for example to damage caused by secondary electrons produced during plasma ignition.

Those skilled in the art will appreciate that the implementation of the present invention herein can be varied, and that the invention is described in preferred embodiments. Accordingly, additions and modifications can be made without departing from the principles and intentions of the invention.

What is claimed is:

1. A method of physical vapor deposition onto areas of gallium arsenide wafers comprising the steps of:

providing a PVD apparatus having a vacuum processing chamber therein equipped with a DC magnetron sputtering cathode, the apparatus being configured to perform physical vapor deposition on a substrate in the chamber with process gas maintained therein at a vacuum processing pressure level upon the application of power at a sputtering power level to the sputtering cathode;

placing a gallium arsenide wafer on a substrate holder in the chamber and sealing the chamber from outside atmosphere;

injecting a burst of ignition gas species into the chamber and producing therewith an ignition vacuum pressure level in the chamber that is higher than the vacuum processing pressure level;

igniting a plasma in the ignition gas species at the ignition gas pressure level in the chamber by applying electrical power thereto without applying power at the sputtering power level to the cathode; then reducing the pressure in the chamber to the vacuum processing pressure level while maintaining process gas in the chamber and sustaining the plasma in the process gas; then applying power at the sputtering power level to the sputtering cathode and sputtering material from the sputtering cathode and onto the wafer to form a film of the sputtered material on the wafer; and performing at least one parameter controlling step selected from the group of parameter controlling steps consisting of:

selecting an ignition gas species that is different from the species of the process gas and performing the ignition gas species injecting step and the plasma igniting step therewith then exhausting the ignition gas species from the chamber while reducing the pressure in the chamber to the vacuum processing pressure level and maintaining process gas in the chamber and sustaining the plasma in the process gas, before applying the power at the sputtering power level to the sputtering cathode and sputtering material from the sputtering cathode and onto the wafer to form the film of the sputtered material on the wafer, changing the DC magnetron of the PVD apparatus to increase magnetic field strength adjacent the sputtering cathode while performing the plasma igniting step then reducing said magnetic field strength when applying the power at the sputtering power level to the sputtering cathode and sputtering material from the sputtering cathode and onto the wafer to form the film of the sputtered material on the wafer, increasing the distance from the wafer to the sputtering cathode from a lesser distance when sputtering material from the sputtering cathode onto the wafer to a greater distance when igniting the plasma and then decreasing said distance to said lesser distance when sputtering material from the sputtering cathode onto the wafer to form the film of the sputtered material on the wafer, and limiting the electrical potential of the wafer when igniting the plasma with a zener diode connected between the wafer and a system ground.

2. The method of claim 1 wherein the at least one parameter controlling step includes:

selecting a species of ignition gas that is different from the species of the process gas and performing the ignition gas species injecting step therewith then exhausting the ignition gas species from the chamber while reducing the pressure in the chamber to the vacuum processing pressure level and maintaining process gas in the chamber and sustaining the plasma in the process gas, before applying the power at the sputtering power level to the sputtering cathode and sputtering material from the sputtering cathode and onto the wafer to form the film of the sputtered material on the wafer.

3. The method of claim 2 wherein:

the ignition gas species selecting step includes the step of selecting the species of ignition gas from the group consisting of krypton and xenon and performing the ignition gas species injecting step therewith; and the step of reducing the pressure in the chamber to the vacuum processing pressure level includes maintaining the chamber filled with argon process gas and then applying power at the sputtering power level to the sputtering cathode and sputtering the material from the sputtering cathode with argon ions.

4. The method of claim 2 wherein:

the ignition gas selecting step includes the step of selecting ignition gas species that includes fluorinated molecular gases and performing the ignition gas species injecting step therewith; and the step of reducing the pressure in the chamber to the vacuum processing pressure level includes maintaining the chamber filled with argon process gas and then applying power at the sputtering power level to the sputtering cathode and sputtering the material from the sputtering cathode with argon ions.

5. The method of claim 1 wherein the at least one parameter controlling step includes:

changing the DC magnetron of the PVD apparatus to increase magnetic field strength adjacent the sputtering cathode while performing the plasma igniting step then reducing said magnetic field strength when applying the power at the sputtering power level to the sputtering cathode and sputtering material from the sputtering cathode and onto the wafer to form the film of the sputtered material on the wafer.

6. The method of claim 1 wherein the at least one parameter controlling step includes:

providing the DC magnetron of the PVD apparatus and generating therewith a magnetic field strength adjacent the sputtering cathode of approximately 400 Gauss while performing the plasma igniting step then reducing said magnetic field strength when applying the power at the sputtering power level to the sputtering cathode and sputtering material from the sputtering cathode and onto the wafer to form the film of the sputtered material on the wafer.

7. The method of claim 1 wherein the at least one parameter controlling step includes:

increasing the distance from the substrate holder to the sputtering cathode while performing the plasma igniting step and then decreasing said distance to said lesser distance when sputtering material from the sputtering cathode onto the wafer to form the film of the sputtered material on the wafer.

8. The method of claim 7 wherein:

the distance increasing step includes increasing the distance from the substrate holder to the sputtering cathode while performing the plasma igniting step to a distance that is approximately twice the distance from the substrate holder to the sputtering cathode during the sputtering of material from the cathode onto the wafer.

9. The method of claim 1 further comprising the step of:

preconditioning the cathode by sputtering material therefrom before performing the ignition gas species injecting step.

10. The method of claim 1 further comprising the step of:

after the chamber has been opened or when sputter processing from the cathode has been interrupted for at least approximately twenty minutes, preconditioning the cathode by sputtering material therefrom before placing the wafer on the substrate holder, injecting the burst of ignition gas species and igniting the plasma.

11. The method of claim 1 further comprising the step of:

applying power at the sputtering power level to the sputtering cathode by gradually increasing power to the cathode from a lower level and sputtering material from the sputtering cathode and onto the wafer to form a film of the sputtered material on the wafer.

12. The method of claim 11 further comprising the step of:

applying power at the sputtering power level to the cathode by gradually increasing the power to the sputtering power level over a period of at least approximately six seconds.

13. The method of claim 1 wherein:
the electrical potential of the wafer is limited by connecting a zener diode between the substrate holder and a potential that is fixed relative to ground.

14. A physical vapor deposition apparatus having a controller programmed to operate the apparatus by the method according to claim 1.

15. A physical vapor deposition method of depositing metal onto areas of wafers that are susceptible to damage during ignition of a plasma, the method comprising the steps of:
providing a PVD apparatus having a vacuum processing chamber therein equipped with a DC magnetron sputtering cathode comprising a metal target, the apparatus being configured to perform physical vapor deposition on a substrate in the chamber with process gas maintained therein at a vacuum processing pressure level upon the application of power at a sputtering power level to the sputtering cathode;
placing a wafer on a substrate holder in the chamber and sealing the chamber from outside atmosphere;
injecting a burst of ignition gas species into the chamber and producing therewith an ignition vacuum pressure level in the chamber that is higher than the vacuum processing pressure level;
igniting a plasma in the ignition gas species at the ignition gas pressure level in the chamber by applying electrical power thereto without applying power at the sputtering power level to the cathode; then
reducing the pressure in the chamber to the vacuum processing pressure level while maintaining process gas in the chamber and sustaining the plasma in the process gas; then
applying power at the sputtering power level to the sputtering cathode and sputtering metal from the sputtering cathode and onto the wafer to form a film of the sputtered metal on the wafer; and
performing at least one parameter controlling step selected from the group of parameter controlling steps consisting of:
selecting an ignition gas species that is different from the species of the process gas and performing the ignition gas species injecting step and the plasma igniting step therewith then exhausting the ignition gas species from the chamber while reducing the pressure in the chamber to the vacuum processing pressure level and maintaining process gas in the chamber and sustaining the plasma in the process gas, before applying the power at the sputtering power level to the sputtering cathode and sputtering metal from the sputtering cathode and onto the wafer to form the film of the sputtered metal on the wafer,
changing the DC magnetron of the PVD apparatus to increase magnetic field strength adjacent the sputtering cathode while performing the plasma igniting step then reducing said magnetic field strength when applying the power at the sputtering power level to the sputtering cathode and sputtering metal from the sputtering cathode and onto the wafer to form the film of the sputtered metal on the wafer,
increasing the distance from the wafer to the sputtering cathode from a lesser distance when sputtering material from the sputtering cathode onto the wafer to a greater distance when igniting the plasma and then decreasing said distance to said lesser distance when sputtering metal from the sputtering cathode onto the wafer to form the film of the sputtered metal on the wafer, and
limiting the electrical potential of the wafer when igniting the plasma with a zener diode connected between the wafer and a system ground.

16. The method of claim 15 further comprising the step of:
preconditioning the target by sputtering material therefrom before performing the ignition gas species injecting step.

17. The method of claim 15 further comprising the step of:
after the chamber has been opened or when sputter processing from the target has been interrupted for at least approximately twenty minutes, preconditioning the target by sputtering metal therefrom before placing the wafer on the substrate holder, injecting the burst of ignition gas species and igniting the plasma.

18. The method of claim 15 further comprising the step of:
applying power at the sputtering power level to the sputtering cathode by gradually increasing power to the cathode from a lower level and sputtering metal from the sputtering cathode and onto the wafer to form a film of the sputtered metal on the wafer.

19. The method of claim 18 further comprising the step of:
applying power at the sputtering power level to the cathode by gradually increasing the power to the sputtering power level over a period of at least approximately six seconds.

20. A physical vapor deposition apparatus having a controller programmed to operate the apparatus by the method according to claim 15.

21. The method of claim 15 further comprising:
performing at least two different parameter controlling steps selected from said group of parameter controlling steps.

22. The method of claim 21 wherein the at least two different parameter controlling steps include:
increasing the distance from the substrate holder to the sputtering cathode while performing the plasma igniting step and then decreasing said distance to said lesser distance when sputtering metal from the sputtering cathode onto the wafer to form the film of the sputtered metal on the wafer; and
changing the DC magnetron of the PVD apparatus to increase magnetic field strength adjacent the sputtering cathode while performing the plasma igniting step then reducing said magnetic field strength when applying the power at the sputtering power level to the sputtering cathode and sputtering metal from the sputtering cathode and onto the wafer to form the film of the sputtered metal on the wafer.

23. The method of claim 15 further comprising:
performing at least three different parameter controlling steps selected from said group of parameter controlling steps.

24. The method of claim 23 wherein the at least three different parameter controlling steps include:
increasing the distance from the substrate holder to the sputtering cathode while performing the plasma igniting step and then decreasing said distance to said lesser distance when sputtering metal from the sputtering cathode onto the wafer to form the film of the sputtered metal on the wafer;
changing the DC magnetron of the PVD apparatus to increase magnetic field strength adjacent the sputtering cathode while performing the plasma igniting step then reducing said magnetic field strength when applying the power at the sputtering power level to the sputtering cathode and sputtering metal from the sputtering cathode and onto the wafer to form the film of the sputtered metal on the wafer; and limiting the electrical potential of the wafer when igniting the plasma with a zener diode connected between the wafer and a potential that is fixed relative to a system ground.

25. The method of claim 15 wherein:

the performing of at least one parameter controlling step includes performing the combination of all four of the parameter controlling steps of which said group consists.

26. The method of claim 25 further comprising:

preconditioning the target by sputtering material therefrom before performing the ignition gas species injecting step.

27. The method of claim 26 further comprising:

applying power at the sputtering power level to the sputtering cathode by gradually increasing power to the cathode from a lower level and sputtering metal from the sputtering cathode and onto the wafer to form a film of the sputtered metal on the wafer.

28. The method of claim 25 further comprising:

applying power at the sputtering power level to the sputtering cathode by gradually increasing power to the cathode from a lower level and sputtering metal from the sputtering cathode and onto the wafer to form a film of the sputtered metal on the wafer.

29. A physical vapor deposition method of depositing metal onto areas of wafers that are susceptible to damage during ignition of a plasma, the method comprising the steps of:

placing a wafer on a substrate holder in the vacuum processing chamber of a PVD apparatus having a process gas maintained therein at a vacuum processing pressure level and sealing the chamber from outside atmosphere;

injecting a burst of ignition gas species that is different from the species of the process gas into the chamber and producing therewith an ignition vacuum pressure level in the chamber that is higher than the vacuum processing pressure level;

igniting a plasma in the ignition gas species at the ignition gas pressure level in the chamber by applying electrical power thereto without applying power at a sputtering power level to a magnetron sputtering cathode comprising a metal target in the chamber; then reducing the pressure in the chamber to the vacuum processing pressure level while maintaining process gas in the chamber and sustaining the plasma in the process gas; then applying power at the sputtering power level to the magnetron sputtering cathode and sputtering metal therefrom and onto the wafer to form a film of the sputtered metal on the wafer.

30. The method of claim 29 wherein:

an ignition gas species selecting step includes the step of selecting the species of ignition gas from the group consisting of krypton and xenon and performing the ignition gas species injecting step therewith; and the step of reducing the pressure in the chamber to the vacuum processing pressure level includes maintaining the chamber filled with argon process gas and then applying power at the sputtering power level to the sputtering cathode and sputtering the metal from the sputtering cathode with argon ions.

31. The method of claim 29 wherein:

an ignition gas selecting step includes the step of selecting ignition gas species that includes fluorinated molecular gases and performing the ignition gas species injecting step therewith; and the step of reducing the pressure in the chamber to the vacuum processing pressure level includes maintaining the chamber filled with argon process gas and then applying power at the sputtering power level to the sputtering cathode and sputtering the metal from the sputtering cathode with argon ions.

32. A physical vapor deposition method of depositing metal onto areas of wafers that are susceptible to damage during ignition of a plasma, the method comprising the steps of:

placing a wafer on a substrate holder in the vacuum processing chamber of a PVD apparatus having a process gas maintained therein at a vacuum processing pressure level and sealing the chamber from outside atmosphere;

injecting a burst of ignition gas species into the chamber and producing therewith an ignition vacuum pressure level in the chamber that is higher than the vacuum processing pressure level;

igniting a plasma in the ignition gas species at the ignition gas pressure level in the chamber by applying electrical power thereto without applying power at a sputtering power level to a magnetron sputtering cathode comprising a metal target in the chamber; then reducing the pressure in the chamber to the vacuum processing pressure level while maintaining process gas in the chamber and sustaining the plasma in the process gas; and applying power at the sputtering power level to the magnetron sputtering cathode and sputtering metal therefrom and onto the wafer to form a film of the sputtered metal on the wafer while limiting the electrical potential of the wafer when igniting the plasma with a zener diode connected between the wafer and a potential that is fixed relative to ground.

33. A physical vapor deposition method of depositing metal onto areas of wafers that are susceptible to damage during ignition of a plasma, the method comprising the steps of:

placing a wafer on a substrate holder in the vacuum processing chamber of a PVD apparatus having a process gas maintained therein at a vacuum processing pressure level and sealing the chamber from outside atmosphere;

injecting a burst of ignition gas species into the chamber and producing therewith an ignition vacuum pressure level in the chamber that is higher than the vacuum processing pressure level;

while maintaining the distance from the substrate holder to the sputtering target at a plasma ignition distance, igniting a plasma in the ignition gas species at the ignition gas pressure level in the chamber by applying electrical power thereto without applying power at a sputtering power level to a magnetron sputtering cathode comprising a metal target in the chamber; then reducing the pressure in the chamber to the vacuum processing pressure level while maintaining process gas in the chamber and sustaining the plasma in the process gas;

reducing the distance from the substrate holder to the sputtering target from the plasma ignition distance to a shorter processing distance; and applying power at the sputtering power level to the magnetron sputtering cathode and sputtering metal therefrom and onto the wafer to form a film of the sputtered metal on the wafer.

34. The method of claim 33 wherein:

the plasma ignition distance from the substrate holder to the sputtering target during ignition of the plasma is approximately twice the processing distance from the substrate holder to the sputtering target during the sputtering of metal from the target onto the wafer.

35. A physical vapor deposition method of depositing metal onto areas of wafers that are susceptible to damage during ignition of a plasma, the method comprising the steps of:

placing a wafer on a substrate holder in the vacuum processing chamber of a PVD apparatus having a process gas maintained therein at a vacuum processing pressure level and sealing the chamber from outside atmosphere;

injecting a burst of ignition gas species into the chamber and producing therewith an ignition vacuum pressure level in the chamber that is higher than the vacuum processing pressure level;

igniting a plasma in the ignition gas species at the ignition gas pressure level in the chamber by applying electrical power thereto without applying power at a sputtering power level to a magnetron sputtering cathode in the chamber but with a magnetic field maintained at a plasma ignition strength adjacent a metal target of the magnetron sputtering cathode; then reducing the pressure in the chamber to the vacuum processing pressure level while maintaining process gas in the chamber and sustaining the plasma in the process gas;

reducing the strength of the magnetic field from the plasma ignition strength to a lower magnetron sputtering strength; and applying power at the sputtering power level to the magnetron sputtering cathode and sputtering metal therefrom and onto the wafer to form a film of the sputtered metal on the wafer.

36. The method of claim 35 wherein:

the plasma ignition strength of the magnetic field adjacent the sputtering target is approximately 400 Gauss during the performing of the plasma igniting step.

* * * * *

UNITED STATES PATENT AND TRADEMARK OFFICE
CERTIFICATE OF CORRECTION

PATENT NO. : 6,156,164            Page 1 of 1
DATED : December 5, 2000
INVENTOR(S) : Smolanoff et al.

It is certified that error appears in the above-identified patent and that said Letters Patent is hereby corrected as shown below:

<u>Column 6,</u>
Line 53, reads "1 04 meters" and should read -- $10^{-4}$ meters --.

Signed and Sealed this

Twelfth Day of February, 2002

*Attest:*

JAMES E. ROGAN
*Attesting Officer*     *Director of the United States Patent and Trademark Office*